(12) United States Patent
Okai et al.

(10) Patent No.: US 8,476,739 B2
(45) Date of Patent: Jul. 2, 2013

(54) GRAPHENE GROWN SUBSTRATE AND ELECTRONIC/PHOTONIC INTEGRATED CIRCUITS USING SAME

(75) Inventors: Makoto Okai, Tokorozawa (JP); Motoyuki Hirooka, Hitachi (JP); Takashi Kyotani, Natori (JP); Hironori Orikasa, Toyonaka (JP)

(73) Assignee: Hitachi, Ltd., Tokyo (JP)

( * ) Notice: Subject to any disclaimer, the term of this patent is extended or adjusted under 35 U.S.C. 154(b) by 268 days.

(21) Appl. No.: 12/624,437

(22) Filed: Nov. 24, 2009

(65) Prior Publication Data

US 2010/0200839 A1    Aug. 12, 2010

(30) Foreign Application Priority Data

Nov. 26, 2008   (JP) ................................. 2008-300556
Oct. 21, 2009   (JP) ................................. 2009-242092

(51) Int. Cl.
*H01L 23/58* (2006.01)

(52) U.S. Cl.
USPC .............. 257/632; 257/E21.24; 257/E23.001; 257/29; 257/E29.068; 257/E31.003; 438/479; 438/481; 438/496; 438/526; 438/758

(58) Field of Classification Search
USPC .............. 257/632, E21.24, E23.001, E29.068, 257/E31.003, 29; 438/479, 481, 496, 526, 438/758

See application file for complete search history.

(56) References Cited

U.S. PATENT DOCUMENTS

2009/0079040 A1*   3/2009   Schultz et al. ................. 257/632
2011/0108805 A1*   5/2011   Okai ............................... 257/26

OTHER PUBLICATIONS

Wang et al. "Atomic Layer Depostion of Metal Oxides on Pristine ad Functionalized Graphene" Jun. 5, 2008, JACS Communications, vol. 130, No. 26, pp. 8152-8153. American Chemical Society.*
K. S. Novoselov et al: Two-dimensional gas of massless Dirac fermions in graphene; Nature Letters; Nov. 2005; pp. 197-200; vol. 438.
Shiro Entani et al.; of nanographite on Pt (111) and its edge state; Applied Physics Letters 88, 153126; 2006.
Yu Miyamoto et al.; Graphene/graphite formation by heat treatment of a 3C-SiC(111) thin film grown on a Si (110) substrate; Conference Proceedings of the 69th Autumn Meeting at Chubu University, the Japan Society of Applied Physics, P808, 2008.

* cited by examiner

*Primary Examiner* — Telly Green
(74) *Attorney, Agent, or Firm* — Antonelli, Terry, Stout & Kraus, LLP.

(57) ABSTRACT

A graphene-on-oxide substrate according to the present invention includes: a substrate having a metal oxide layer formed on its surface; and, formed on the metal oxide layer, a graphene layer including at least one atomic layer of the graphene. The graphene layer is grown generally parallel to the surface of the metal oxide layer, and the inter-atomic-layer distance between the graphene atomic layer adjacent to the surface of the metal oxide layer and the surface atomic layer of the metal oxide layer is 0.34 nm or less. Preferably, the arithmetic mean surface roughness Ra of the metal oxide layer is 1 nm or less.

12 Claims, 8 Drawing Sheets

GRAPHENE GROWN SUBSTRATE AND ELECTRONIC/PHOTONIC INTEGRATED CIRCUITS USING SAME

CLAIM OF PRIORITY

The present application claims priority from Japanese patent application serial no. 2009-242092 filed on Oct. 21, 2009, which further claims priority from Japanese patent application serial no. 2008-300556 filed on Nov. 26, 2008, the contents of which are hereby incorporated by reference into this application.

BACKGROUND OF THE INVENTION

1. Field of the Invention

The present invention relates to graphenes for use in electronic and optical device applications. The invention particularly relates to substrates having a graphene layer grown thereon, and electro-optical integrated circuits formed in such a substrate.

2. Description of Related Art

Graphenes (also called graphene sheets) are a sheet of six-membered rings which does not form a closed surface, and are formed by connecting numerous benzene rings two-dimensionally. Carbon nanotubes are formed by rolling up a graphene sheet into a tubular structure. Graphites are formed by stacking multiple graphene sheets. Each carbon atom in a graphene sheet has an $sp^2$ hybrid orbital, and delocalized electrons are present at opposite surfaces of a graphene sheet.

The following typical physical properties of graphenes have been reported: (a) The carrier mobility is in the order of 200,000 $cm^2$/Vs, which is one order of magnitude higher than those of silicon (Si) crystals and is also higher than those of metals and carbon nanotubes. (b) The 1/f noises of typical nanodevices can be significantly reduced. (c) The refractive index is negative. (d) The surface electrons behave as if they have no mass. Because of these properties, graphenes are identified as a candidate for post-silicon electronic materials.

In order to achieve graphene-based electronic and optical devices, a substrate having a graphene layer grown thereon is needed. Novoselov et al. reports a method for forming graphene on a substrate, in which a graphene film is separated from a highly oriented graphite crystal using an adhesive tape and then the removed graphene layer is transferred to the substrate. See e.g., K. S. NOVOSELOV, A. K. GEIM, S. V. MOROZOV, D. JIANG, M. I. KATSNELSON, I. V. GRIGORIEVA, S. V. DUBONOS, AND A. A. FIRSOV: "Two-dimensional gas of massless Dirac fermions in graphene", Nature 438, 197 (2005).

Entani et al. reports a method for forming a graphite nanolayer on a platinum substrate by chemical vapor deposition using a specially designed ultrahigh vacuum apparatus. See. e.g., Shiro ENTANI, Susumu IKEDA, Manabu KIGUCHI, Koichiro SAIKI, Genki YOSHIKAWA, Ikuyo NAKAI, Hiroshi KONDOH, and Toshiaki OHTA: "Growth of nanographite on Pt(111) and its edge state", Appl. Phys. Lett. 88, 153126 (2006).

Miyamoto et al. reports a method of growing, on an Si $(110)_{Si}$ substrate, an 80-nm thick preferentially $(111)_{SiC}$ oriented thin film of cubic silicon carbide (3C—SiC), and then thermally modifying the 3C—SiC thin film in ultrahigh vacuum. See. e.g., Yu MIYAMOTO, Maki SUEMITSU, Hiroyuki HANDA, and Atsushi KONNO: "Graphene/graphite formation by heat treatment of a 3C—SiC(111) thin film grown on a Si(110) substrate", Conference Proceedings of the 69th Autumn Meeting at Chubu University, the Japan Society of Applied Physics, p. 808 (2008).

The above methods have the following problems: The method reported by Novoselov et al. is feasible on an experimental basis, but is not suitable for industrial applications because it is difficult for the method to provide large size substrates. The method reported by Entani et al. has an advantage in that the graphite nanolayer can be formed at relatively low temperatures (room temperature to 850 K). However, the method has a manufacturing cost problem because it requires a specially designed ultrahigh vacuum apparatus. The method reported by Miyamoto et al. has an advantage in which the graphene film can be formed on Si substrates. However, the method requires high temperature treatment (about 1350° C.) in ultrahigh vacuum, and therefore the type of substrate that can be used is limited and also the manufacturing cost is high.

SUMMARY OF THE INVENTION

Under these circumstances, it is an objective of the present invention to solve the above problems and to provide a substrate having a graphene layer grown thereon and an electro-optical integrated circuit formed in such a substrate, which can be formed using large base substrates of various types at low cost.

(1) According to one aspect of the present invention, there is provided a graphene-on-oxide substrate including:

a substrate having a metal oxide layer formed on its surface; and a graphene layer formed on the metal oxide layer, the graphene layer including at least one atomic layer of the graphene (single atomic layer or multiple atomic layers of graphene), the graphene layer being grown parallel to the surface of the metal oxide layer, the inter-atomic-layer distance between the graphene atomic layer adjacent to the surface of the metal oxide layer and the surface atomic layer of the metal oxide layer being 0.34 nm or less.

As used herein, the term "multiple atomic layers of graphene" refers to "20 or less atomic layers of graphene". In a graphene layer having more than 20 atomic layers, the physical properties (such as electron mobility) are almost the same as those of bulk graphites, and as a result various useful properties inherent to graphene will be lost. More preferably, the graphene layer of the present invention has 10 or less atomic layers of graphene. Furthermore, the term "parallel to a substrate" means macroscopically (substantially) parallel to the substrate surface (e.g., "macroscopic" means the order of 1 μm or more)". In this case, microscopic roughness of the substrate surface less than 1 μm is not taken into consideration. For example, the substrate surface having microscopic roughness less than 10 nm is considered to be flat and smooth (hypothetically leveled off). In other words, fluctuation from parallelism of the graphene layer due to the microscopic surface roughness of a substrate is not taken into consideration. Moreover, the term "atom" includes ions.

In the above aspect (1) of the present invention, the following modifications and changes can be made.

(i) The arithmetic mean surface roughness Ra of the metal oxide layer is 1 nm or less. As used herein, the term "arithmetic mean surface roughness" refers to the arithmetic mean roughness of the surface of a substrate before a graphene layer is formed on the substrate, or refers to the arithmetic mean roughness of the interface between atomic layers of metal oxide and a graphene layer formed on the atomic layers of metal oxide after the graphene layer has been formed on the atomic layers of metal oxide.

(ii) The maximum surface height Rz of the metal oxide layer is 10 nm or less. As used herein, the term "maximum surface height" refers to the maximum surface height of the surface of a substrate before a graphene layer is formed on the substrate, or refers to the maximum surface height of the interface between atomic layers of metal oxide and a graphene layer formed on the atomic layers of metal oxide after the graphene layer has been formed on the atomic layers of metal oxide.

(iii) The graphene layer is formed of graphene crystal grains, and the average grain size of the graphene crystal grains is 5 nm or more.

(iv) The metal oxide layer contains aluminum and/or silicon.

(v) The metal oxide layer is polycrystalline, and the average thickness of the polycrystalline metal oxide layer is 10 nm or more and 500 nm or less.

(vi) The substrate is a single crystalline metal oxide substrate.

(vii) In the above modification (vi), the single crystalline metal oxide substrate is a single crystalline α-alumina c-plane substrate. In the present invention, α-alumina crystal has a hexagonal structure.

(2) According to another aspect of the present invention, there is provided a graphene-on-oxide substrate including:

a single crystalline α-alumina c-plane substrate; and a graphene layer formed on the α-alumina c-plane substrate, the graphene layer including at least one atomic layer of the graphene (single atomic layer or multiple atomic layers of graphene), the graphene layer being grown parallel to the surface of the α-alumina c-plane substrate and being formed of graphene crystal grains, the graphene crystal grain including an adjacent atomic layer which is one of the at least one atomic layer of the graphene adjacent to the surface of the α-alumina c-plane substrate, each atomic layer of the graphene crystal grain being formed of a network of six-carbon rings, the six-carbon rings of the adjacent atomic layer of the graphene crystal grain being aligned in a specific geometric relationship with the structure of the surface atomic layer of the α-alumina c-plane substrate.

In the above aspect (2) of the present invention, the following modifications and changes can be made.

(viii) The surface atomic layer of the α-alumina c-plane substrate has valley-like atomic sites, each surrounded by a triangle of neighboring three oxygen atoms; and each carbon atom in each six-carbon ring of the adjacent atomic layer faces a corresponding one of the valley-like atomic sites so that each six-carbon ring of the adjacent atomic layer faces a hexagon formed by the six valley-like atomic sites surrounding one oxygen atom.

(ix) The surface atomic layer of the single crystalline α-alumina c-plane substrate has a network of six-aluminum hexagons, each six-aluminum hexagon has six "A-sites" which are the six vertices of the six-aluminum hexagon; each six-aluminum hexagon has a "B-site" which is the center of the six-aluminum hexagon, and each six-aluminum hexagon has three "C-sites" which are the centers of three alternate triangles of the six triangles formed by the three diagonals that join opposite vertices of the six-aluminum hexagon; and the six carbon atoms in each six-carbon ring of the adjacent atomic layer face A-, C-, B-, C-, A- and C-sites respectively in clockwise order in such a manner that the six-carbon ring faces a hexagon formed by the six sites.

(x) The inter-atomic-layer distance between the adjacent atomic layer of the graphene crystal grain and the surface atomic layer of the single crystalline α-alumina c-plane substrate is 0.34 nm or less.

In the above aspects (1) and (2) of the present invention, the following modifications and changes can be made.

(xi) The graphene-on-oxide substrate has an area of 20 cm$^2$ or more. As used herein, the term "area of a substrate" means the area of one main surface (e.g., upper surface) of the substrate.

(xii) There is provided an electro-optical integrated circuit formed in the graphene-on-oxide substrate.

(xiii) In the above modification (xii), a channel of a field effect transistor, an optical emitting device, an optical receiving device and circuit wiring are formed in the graphene layer of the graphene-on-oxide substrate.

(3) According to still another aspect of the present invention, there is provided a method for fabricating a graphene-on-oxide substrate, the method including:

a substrate preparation step of forming a substrate having a metal oxide layer on at least one main surface thereof, the metal oxide layer having an arithmetic mean surface roughness Ra of 1 nm or less; and a graphene layer forming step of forming a graphene layer on the metal oxide layer by chemical vapor deposition using a carbon-containing compound as a starting material, the graphene layer including at least one atomic layer of the graphene, the graphene layer being grown generally parallel to the surface of the metal oxide layer.

In the above aspect (3) of the present invention, the following modifications and changes can be made.

(xiv) The method further includes, after the graphene layer forming step, a graphene crystallizing step of promoting crystallization of the graphene layer by a heat treatment.

(xv) In the above modification (xiv), the heat treatment is conducted in a non-oxidizing atmosphere at 800 to 1200° C. for 0.5 to 1 hours. As used herein, "a non-oxidizing atmosphere" is an atmosphere which does not oxidize graphene layers of the invention (e.g., an oxygen-free atmosphere such as vacuum, nitrogen and argon).

(xvi) The method further includes, before the graphene layer forming step, a patterning step of patterning the metal oxide layer to form desired circuitry.

(xvii) In the above modification (xvi), the patterning step is conducted using etching and/or masking techniques.

ADVANTAGES OF THE INVENTION

The invention provides a substrate having a graphene layer grown thereon and an electro-optical integrated circuit formed in such a substrate, which can be formed using large base substrates of various types at low cost.

DETAILED DESCRIPTION OF THE PREFERRED EMBODIMENTS

Figure 1:
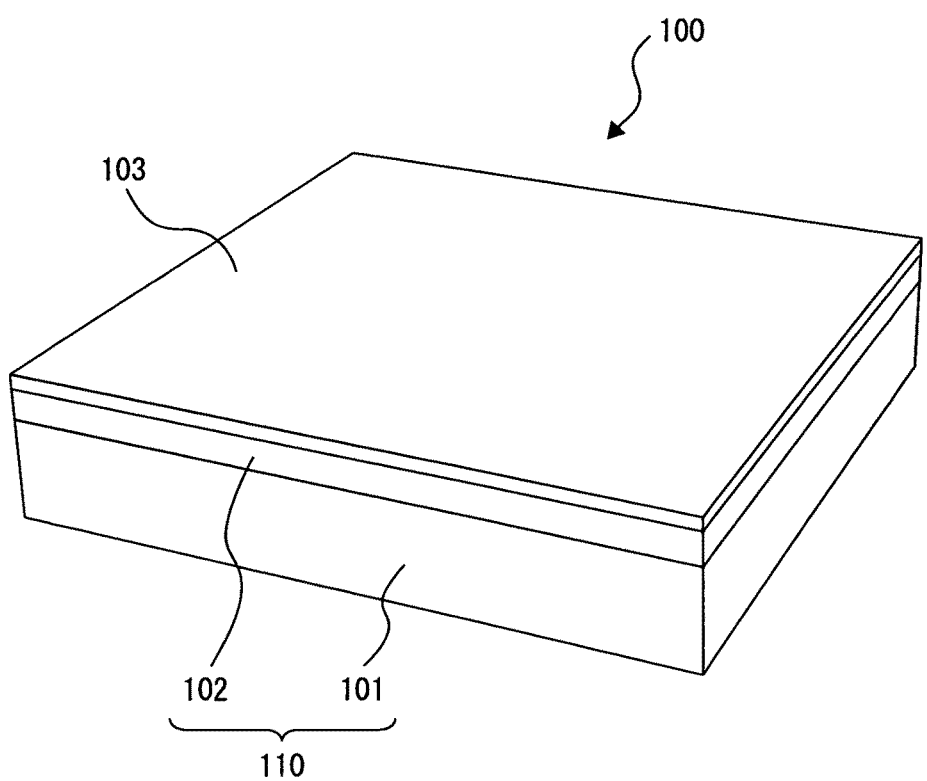
FIG. 1 is a schematic illustration showing a perspective view of an exemplary substrate having a graphene layer grown thereon according to a first embodiment of the present invention.

Preferred embodiments of the present invention will be described below in terms of their fabrication sequence with reference to the accompanying drawings. The invention is not limited to the specific embodiments described below, but various combinations of its features are possible within the scope of the invention. Like parts are designated by like reference numerals without repeating the description thereof.

First Embodiment of Present Invention

FIG. 1 is a schematic illustration showing a perspective view of an exemplary substrate having a graphene layer grown thereon according to a first embodiment of the present invention. First, an aluminum oxide (α-alumina, $Al_2O_3$) film 102 is formed on a single crystalline silicon substrate 101 by sputtering or the like. Thus, a substrate 110 having atomic layers of metal oxide on its surface is obtained. The aluminum oxide film 102 preferably has an average thickness of 10 nm or more and 500 nm or less. An average thickness less than 10 nm is undesirable for the following reason: The crystal grains of the polycrystalline aluminum oxide film 102 do not coalesce sufficiently at thicknesses less than 10 nm (for example, the aluminum oxide film 102 grows like islands). Thus, the surface coverage of the silicon substrate 101 with the aluminum oxide film 102 is insufficient, resulting in poor surface smoothness of the aluminum oxide film 102. On the other hand, an average thickness more than 500 nm is also undesirable because the resulting aluminum oxide film 102 is prone to suffer from cracks caused by, e.g., thermal stresses undergone during subsequent processing, thus resulting in poor surface smoothness (as defined by, e.g., arithmetic mean surface roughness Ra).

Instead of sputtering, laser evaporation (laser ablation) or other methods may be used to form the aluminum oxide film 102 on the silicon substrate 101. Also, the aluminum oxide film 102 may be formed by growing a metal aluminum film on the silicon substrate 101 followed by oxygen plasma processing or the like. In addition, the substrate used to grow the aluminum oxide film 102 thereon is not limited to single crystalline silicon substrates, but other types of substrates may be used. The choice of the substrate is made in consideration of its resistance to thermal cycles during subsequent processes or the specific applications of graphene layers on the substrate (e.g., electro-optical integrated circuits).

The aluminum oxide film 102 preferably has an arithmetic mean surface roughness Ra of 1 nm or less, and more preferably 0.3 nm or less. At an arithmetic mean surface roughness Ra greater than 1 nm, a graphene layer over the aluminum oxide film 102 does not tend to grow in directions parallel to the surface of the aluminum oxide film 102. This is probably because there is some correlation between the nucleation mechanism of graphene on the aluminum oxide film 102 and the arithmetic mean surface roughness Ra of the aluminum oxide film 102. In addition, the aluminum oxide film 102 preferably has a maximum surface height Rz of 10 nm or less, and more preferably 3 nm or less. When a resulting aluminum oxide film 102 has an arithmetic mean surface roughness Ra greater than 1 nm, it is surface-treated by polishing (such as chemical mechanical polishing) until its arithmetic mean surface roughness Ra becomes 1 nm or less. Preferably, the single crystalline silicon substrate 101 is pretreated so as to have an arithmetic mean surface roughness Ra of 1 nm or less before the formation of the aluminum oxide film 102. All of the process steps up to this point are collectively referred to as the "substrate preparation step". As used herein, the term "arithmetic mean surface roughness Ra" and "maximum surface height Rz" are the ones defined in JIS B 0601.

Then, a graphene layer 103 is formed on the aluminum oxide film 102 by CVD (chemical vapor deposition) using a carbon-containing compound as a starting material (a graphene layer forming step). Exemplary growth conditions of CVD are as follows: The starting material is acetylene ($C_2H_2$) and the carrier gas is nitrogen ($N_2$). The average acetylene concentration in the $C_2H_2/N_2$ mixture is 0.2 to 2 volume %. The average flow rate of the $C_2H_2/N_2$ mixture gas over the substrate is 15 to 30 standard cm/min. The growth temperature is 450 to 800° C. and the growth time is 5 to 60 minutes (e.g., 800° C. for 20 minutes). Other carbon-containing compounds (such as methane $CH_4$, propane $C_3H_8$ and ethylene $C_2H_4$) may be employed as the starting material instead of acetylene.

A sample of a graphene layer 103 was formed on an aluminum oxide film 102 on a two-inch diameter silicon substrate 101 under the above-described growth conditions. Scanning probe microscopy examination showed that the resulting graphene layer 103 grown on the aluminum oxide film 102 was a uniform single atomic layer of graphene. The inter-atomic-layer distance between the graphene's single atomic layer 103 and the surface atomic layer of the aluminum oxide film 102 was measured to be 0.30 to 0.34 nm. A separately conducted experiment showed that a graphene layer 103 having several (e.g., ten) atomic layers of graphene could be formed on the aluminum oxide film 102 by properly controlling the growth temperature and time (e.g., 750° C. for 60 minutes).

The crystal growth of the graphene layer 103 formed in the graphene layer forming step can be accelerated by a heat treatment (a graphene crystal growth step). In this crystal growth step, the graphene layer 103 becomes formed of scale-like graphene grains. In the manner described above, there is fabricated a substrate 100 having a graphene layer grown on its surface according to the first embodiment of present invention.

The heat treatment used in the graphene crystal growth step is preferably performed in a non-oxidizing (oxygen-free) atmosphere (such as vacuum, nitrogen and argon) at 800 to 1200° C. for 0.5 to 1 hours. Under this condition, the average grain size of the graphene grains can be made larger than 5 nm. However, the average grain size can be made larger than 8 nm by properly controlling the heat treatment conditions, in particular the heat treatment temperature. Scanning probe microscopy examination showed that a graphene layer 103 which was crystallized by such a properly controlled heat treatment was formed of graphene grains having an average grain size of 10 nm.

Second Embodiment of Present Invention

Figure 2:
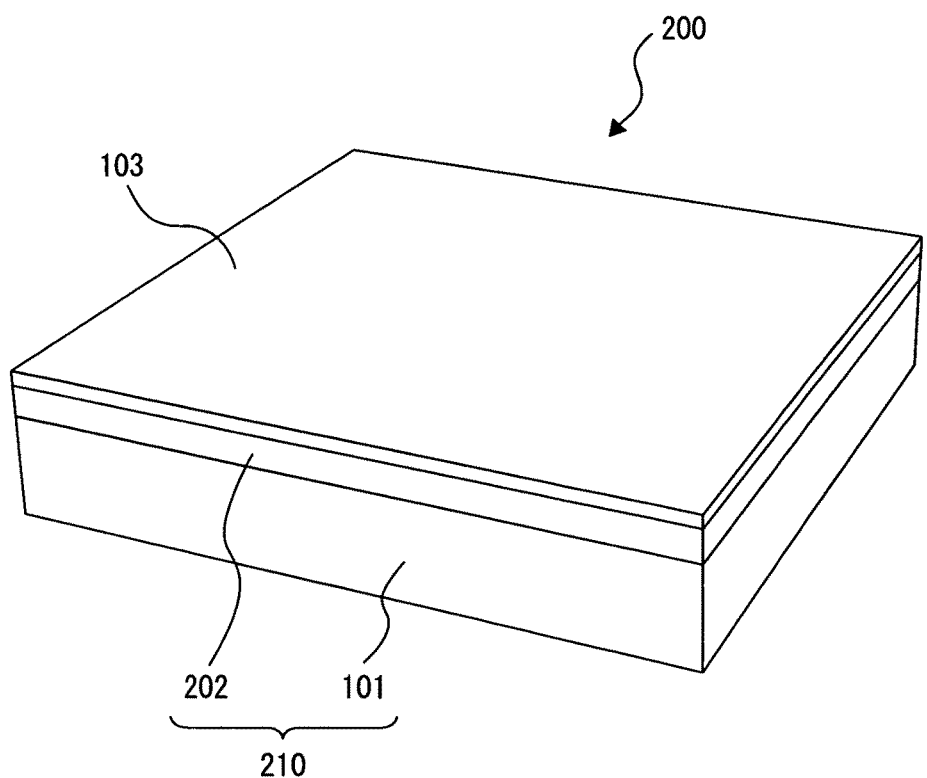
FIG. 2 is a schematic illustration showing a perspective view of an exemplary substrate having a graphene layer grown thereon according to a second embodiment of the present invention.

FIG. 2 is a schematic illustration showing a perspective view of an exemplary substrate having a graphene layer grown thereon according to a second embodiment of the present invention. First, a silicon oxide ($SiO_2$) film 202 is formed on a single crystalline silicon substrate 101 by thermal oxidation or the like. Thus, a substrate 210 having atomic layers of metal oxide on its surface is obtained. The silicon oxide film 202 preferably has an average thickness of 10 to 500 nm. An average thickness of the polycrystalline silicon oxide film 202 less than 10 nm is undesirable because of local nonuniformity in the film thickness (i.e., poor surface smoothness). One reason for such thickness nonuniformity is the fact that island growth occurs during the initial growth stage of the silicon oxide film 202. On the other hand, an average thickness more than 500 nm is also undesirable because the resulting silicon oxide film 202 is prone to suffer from cracks caused by, e.g., thermal stresses undergone during subsequent processing, thus resulting in poor surface smoothness (as defined by, e.g., arithmetic mean surface roughness Ra). The method for forming the silicon oxide film 202 on the single crystalline silicon substrate 101 is not particularly limited to thermal oxidation so long as atomic layers of silicon oxide can be formed on the surface of the substrate 101.

The silicon oxide film 202 preferably has an arithmetic mean surface roughness Ra of 1 nm or less, and more preferably 0.3 nm or less. At an arithmetic mean surface roughness Ra greater than 1 nm, a graphene layer over the silicon oxide film 202 does not tend to grow in directions parallel to the surface of the silicon oxide film 202. This is probably because there is some correlation between the nucleation mechanism of graphene on the silicon oxide film 202 and the arithmetic mean surface roughness Ra of the silicon oxide film 202. In addition, the silicon oxide film 202 preferably has a maximum surface height Rz of 10 nm or less, and more preferably 3 nm or less. When a resulting silicon oxide film 202 has an arithmetic mean surface roughness Ra greater than 1 nm, it is surface-treated by polishing or other methods until its arithmetic mean surface roughness Ra becomes 1 nm or less. Preferably, the single crystalline silicon substrate 101 is pretreated so as to have an arithmetic mean surface roughness Ra of 1 nm or less before the formation of the silicon oxide film 202.

Then, a substrate 200 having a graphene layer 103 grown on the top surface thereof can be fabricated through the graphene layer forming and graphene crystal growth steps similar to those described in the first embodiment. A sample of a graphene layer 103 was formed on a silicon oxide film 202 on a two-inch diameter silicon substrate 101. Scanning probe microscopy examination showed that a uniform single atomic layer of graphene was grown on the silicon oxide film 202, and its average grain size was 8 nm. In addition, the inter-atomic-layer distance between the graphene's single atomic layer 103 and the surface atomic layer of the silicon oxide film 202 was measured to be 0.30 to 0.34 nm.

Third Embodiment of Present Invention

Figure 3:
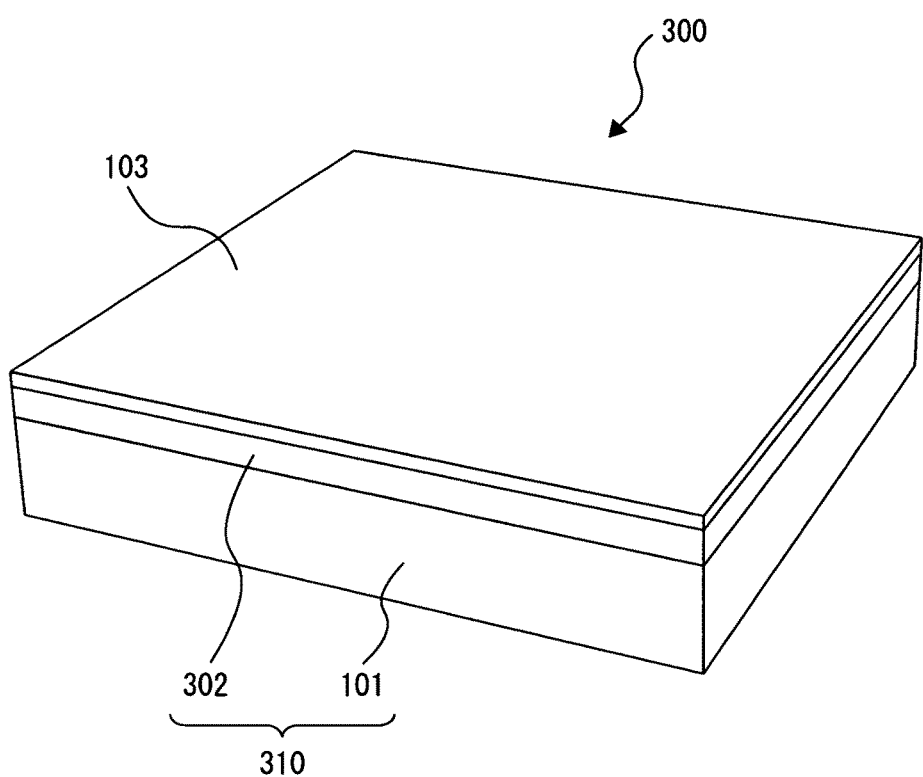
FIG. 3 is a schematic illustration showing a perspective view of an exemplary substrate having a graphene layer grown thereon according to a third embodiment of the present invention.

FIG. 3 is a schematic illustration showing a perspective view of an exemplary substrate having a graphene layer grown thereon according to a third embodiment of the present invention. First, a mullite ($3Al_2O_3.2SiO_2$) film 302 is formed on a single crystalline silicon substrate 101 by sputtering or the like. Thus, a substrate 310 having atomic layers of metal oxide on its surface is obtained. The mullite film 302 preferably has an average thickness of 10 to 500 nm. An average thickness less than 10 nm is undesirable because the grains of the polycrystalline mullite film 302 do not coalesce sufficiently resulting in poor surface coverage of the silicon substrate 101 with the mullite film 302. On the other hand, an average thickness more than 500 nm is also undesirable because the resulting mullite film 302 is prone to suffer from cracks caused by, e.g., thermal stresses undergone during subsequent processing, thus resulting in poor surface smoothness (as defined by, e.g., arithmetic mean surface roughness Ra). Instead of sputtering, laser evaporation (laser ablation) or other methods may be used to form the mullite film 302 on the silicon substrate 101.

The mullite film 302 preferably has an arithmetic mean surface roughness Ra of 1 nm or less, and more preferably 0.3 nm or less. At an arithmetic mean surface roughness Ra greater than 1 nm, a graphene layer over the mullite film 302 does not tend to grow in directions parallel to the surface of the mullite film 302. This is probably because there is some correlation between the nucleation mechanism of graphene on the mullite film 302 and the arithmetic mean surface roughness Ra of the mullite film 302. In addition, the mullite film 302 preferably has a maximum surface height Rz of 10 nm or less, and more preferably 3 nm or less. When a resulting mullite film 302 has an arithmetic mean surface roughness Ra greater than 1 nm, it is surface-treated by polishing or the like until its arithmetic mean surface roughness Ra becomes 1 nm or less. Preferably, the single crystalline silicon substrate 101 is pretreated so as to have an arithmetic mean surface roughness Ra of 1 nm or less before the formation of the mullite film 302.

Then, a substrate 300 having a graphene layer 103 grown on the top surface thereof can be fabricated through the graphene layer forming and graphene crystal growth steps similar to those described in the first embodiment. A sample of a graphene layer 103 was formed on a mullite film 302 on a two-inch diameter silicon substrate 101. Scanning probe microscopy examination showed that a uniform single atomic layer of graphene was grown on the mullite film 302, and its average grain size was 9 nm. In addition, the inter-atomic-layer distance between the graphene's single atomic layer 103 and the surface atomic layer of the mullite film 302 was measured to be 0.30 to 0.34 nm.

Fourth Embodiment of Present Invention

Figure 4:
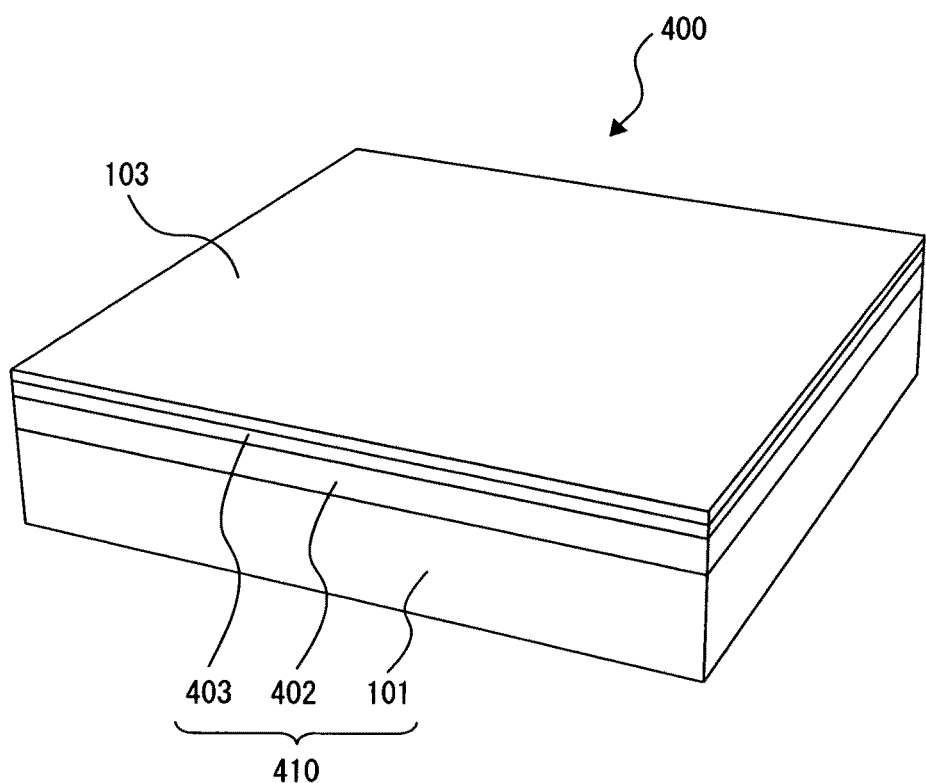
FIG. 4 is a schematic illustration showing a perspective view of an exemplary substrate having a graphene layer grown thereon according to a fourth embodiment of the present invention.

FIG. 4 is a schematic illustration showing a perspective view of an exemplary substrate having a graphene layer grown thereon according to a fourth embodiment of the present invention. First, a metal niobium (Nb) film 402 is formed on a single crystalline silicon substrate 101 by sputtering or the like. Next, a metal aluminum film is formed on the niobium film 402 by sputtering or the like. Then, the aluminum film is anodized to form an aluminum oxide (α-alumina) film 403. Thus, a substrate 410 having atomic layers of metal oxide on the top surface thereof is obtained. Instead of sputtering, laser evaporation (laser ablation) or other methods may be used to form the niobium film 402 and the aluminum film.

Both the niobium film 402 and the aluminum film preferably have an average thickness of 10 to 500 nm. An average thickness of the niobium film 402 less than 10 nm is undesirable because the grains of the polycrystalline niobium film 402 do not coalesce sufficiently thus causing the surface of the niobium film 402 to be rough, and as a result the surface smoothness of the aluminum film is also degraded. On the other hand, an average thickness more than 500 nm is also undesirable because the resulting niobium film 402 is prone to suffer from cracks caused by, e.g., thermal stresses undergone during subsequent processing, thus resulting in poor surface smoothness. The average thickness of the aluminum film is selected so that the average thickness of the aluminum oxide film 403 formed by the anodization is 10 to 500 nm. The substrate used to form thereon the niobium film 402 and the aluminum oxide film 403 is not limited to single crystalline silicon substrates, but other types of substrates may be used. The choice of the substrate is made in consideration of its resistance to thermal cycles during subsequent processes and the specific applications of graphene layers on the substrate (e.g., electro-optical integrated circuits). In addition, the material used for forming the film 402 between the silicon substrate 101 and the aluminum film is not particularly limited to niobium so long as the film 402 can be used as the anode in the below-described anodic oxidation method.

The anodization of the aluminum film is conducted, e.g., as follows: $(NH_4)_2O.5B_2O_3.8H_2O$ is used as the electrolytic solution; the niobium film 402 is used as the anode; an aluminum plate is used as the cathode; and a low anodic current density of 1 $mA/cm^2$ is used. In this anodic oxidation method, the applied voltage is increased as the anodization proceeds, and the thickness of the anodized portion of the aluminum layer is proportional to the final applied voltage (the constant of proportionality is 1.4 nm/V). For example, in order to completely anodize a 100-nm-thick aluminum film, the anodization of the aluminum film is continued until the applied voltage reaches 72 V.

The aluminum oxide film 403 preferably has an arithmetic mean surface roughness Ra of 1 nm or less, and more preferably 0.3 nm or less. The reason for this preference is the same as that described above in the first embodiment. The aluminum oxide film 403 preferably has a maximum surface height Rz of 10 nm or less, and more preferably 3 nm or less. It is, of course, preferred that the single crystalline silicon substrate 101 is pretreated so as to have an arithmetic mean surface roughness Ra of 1 nm or less before the formation of the niobium film 402 and the aluminum oxide film 403.

Then, a substrate 400 having a graphene layer 103 grown on its surface can be fabricated through the graphene layer forming and graphene crystal growth steps similar to those described in the first embodiment. A sample of a graphene layer 103 was formed on an aluminum oxide film 403 on a three-inch diameter silicon substrate 101. Scanning probe microscopy examination showed that a uniform single atomic layer of graphene was grown on the aluminum oxide film 403, and its average grain size was 6 nm. In addition, the inter-atomic-layer distance between the graphene's single atomic layer 103 and the surface atomic layer of the aluminum oxide film 403 was measured to be 0.30 to 0.34 nm.

Fifth Embodiment of Present Invention

Figure 5:
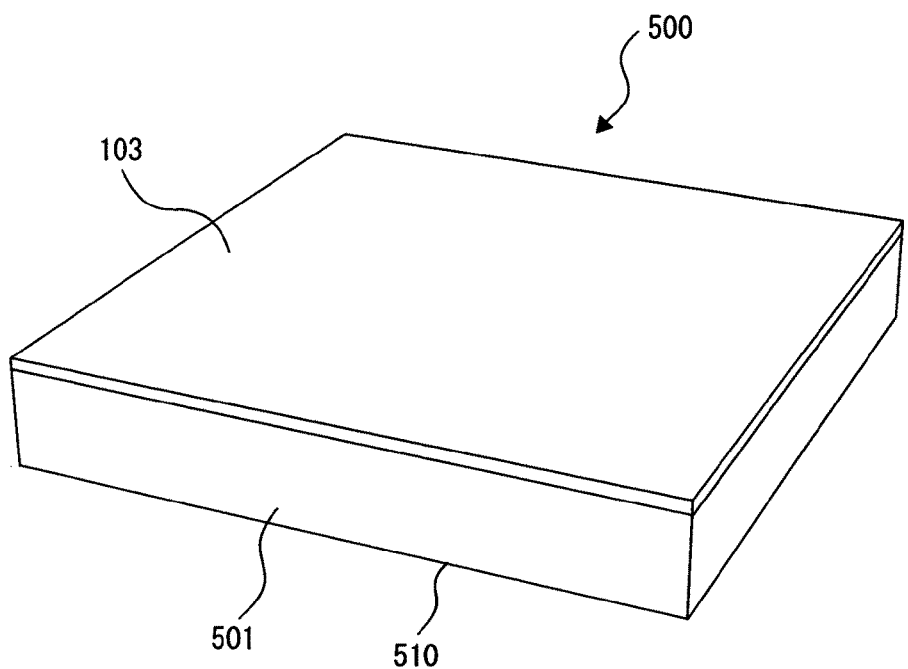
FIG. 5 is a schematic illustration showing a perspective view of an exemplary substrate having a graphene layer grown thereon according to a fifth embodiment of the present invention.

FIG. 5 is a schematic illustration showing a perspective view of an exemplary substrate having a graphene layer grown thereon according to a fifth embodiment of the present invention. First, a single crystalline silicon oxide (quartz) $(111)_{SiO_2}$ substrate 501 is surface-treated so as to have an arithmetic mean surface roughness Ra of 1 nm or less. Thus, a substrate 510 having atomic layers of metal oxide on its surface is prepared.

Then, a substrate 500 having a graphene layer 103 grown on its surface can be fabricated through the graphene layer forming and graphene crystal growth steps similar to those described in the first embodiment. A sample of a graphene layer 103 was formed on a three-inch diameter single crystalline silicon oxide substrate 510. Scanning probe microscopy examination showed that a uniform single atomic layer of graphene was grown on the single crystalline silicon oxide substrate 510, and its average grain size was 9 nm. In addition, the inter-atomic-layer distance between the graphene's single atomic layer 103 and the surface atomic layer of the single crystalline silicon oxide substrate 510 was measured to be 0.30 to 0.34 nm.

Sixth Embodiment of Present Invention

Figure 6:
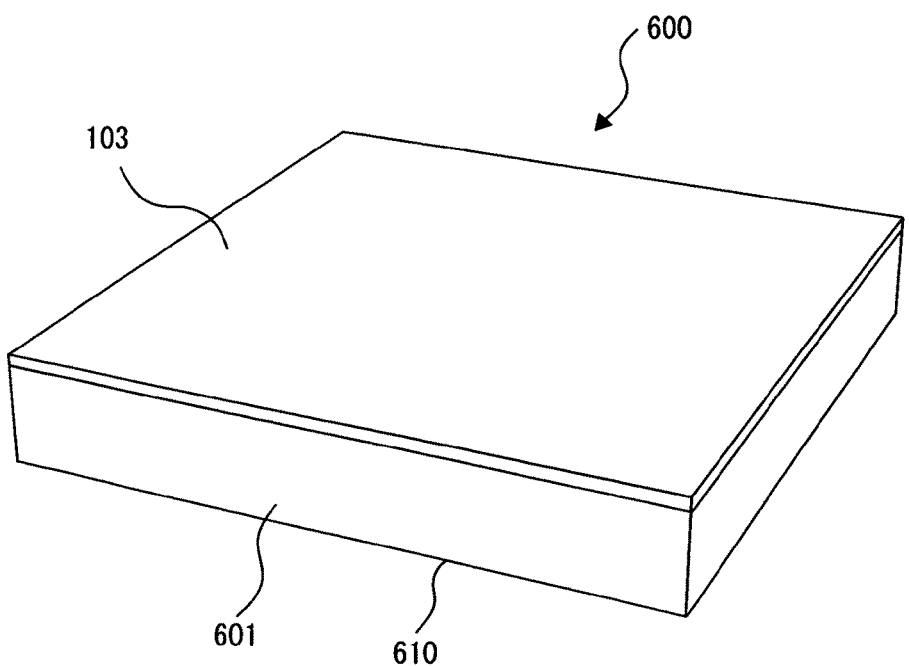
FIG. 6 is a schematic illustration showing a perspective view of an exemplary substrate having a graphene layer grown thereon according to a sixth embodiment of the present invention.

FIG. 6 is a schematic illustration showing a perspective view of an exemplary substrate having a graphene layer grown thereon according to a sixth embodiment of the present invention. First, a single crystalline aluminum oxide (α-alumina) c-plane (0001) substrate 601 (i.e., a c-plane $(0001)_{Al_2O_3}$ sapphire substrate 601) is surface-treated so as to have an arithmetic mean surface roughness Ra of 1 nm or less. Thus, a substrate 610 having atomic layers of metal oxide on its surface is prepared.

Then, a substrate 600 having a graphene layer 103 grown on its surface can be fabricated through the graphene layer forming and graphene crystal growth steps similar to those described in the first embodiment. A sample of a graphene layer 103 was formed on a two-inch diameter single crystalline aluminum oxide (α-alumina) c-plane substrate 610. Scanning probe microscopy examination showed that a uniform single atomic layer of graphene was grown on the single crystalline aluminum oxide c-plane substrate 610, and its average grain size was 10 nm. In addition, the inter-atomic-layer distance between the graphene's single atomic layer 103 and the surface atomic layer of the single crystalline aluminum oxide substrate 610 was measured to be 0.30 to 0.34 nm.

Seventh Embodiment of Present Invention

Detailed observation of the graphene layers grown on the above-described various substrates revealed that the graphene layers grown on the substrates having thereon atomic layers of aluminum oxide had relatively uniform and large graphene crystal grains. Thus, it seems that the atomic layers of aluminum oxide have some desirable thermodynamic effects on the nucleation and crystal growth of the graphene layers.

In particular, observation of the graphene layer on the single crystalline aluminum oxide (α-alumina) c-plane substrate suggested that all of the graphene crystal grains were aligned in a specific geometric relationship with the crystal axes of the substrate. Further observation by scanning tunneling microscopy suggested that the crystal orientation of the graphene crystal grains had a specific relationship with the crystal axes of the substrate. In other words, it seems that the graphene layer is epitaxially grown on the single crystalline α-alumina c-plane substrate.

Figure 7:
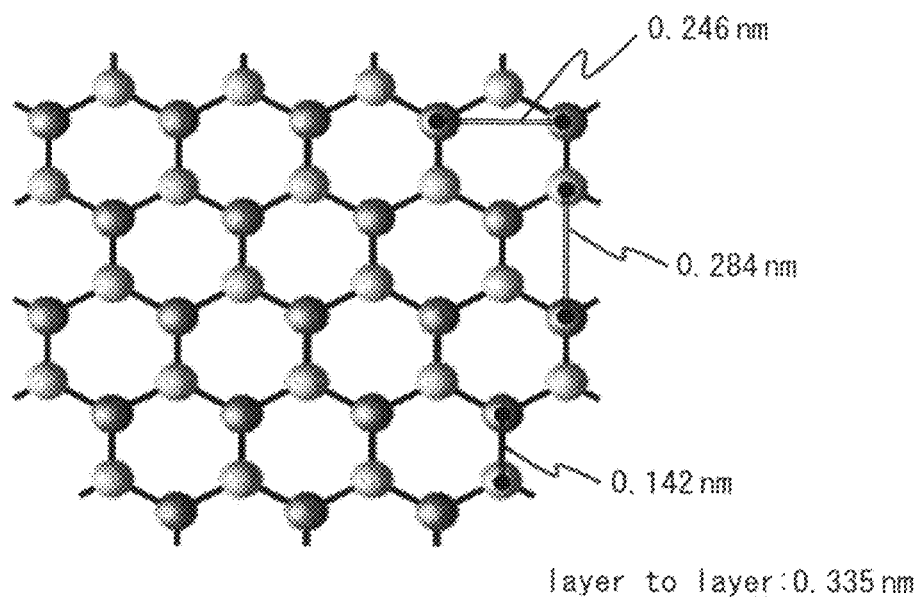
FIG. 7 is a schematic illustration showing the crystal structure of graphene viewed along the c-axis.

Next, the reason why graphene can be epitaxially grown on single crystalline α-alumina c-plane substrates will be discussed. FIG. 7 is a schematic illustration showing the crystal structure of graphene viewed along the c-axis. As illustrated in FIG. 7, a graphene sheet is a network of six-carbon rings (i.e., a honeycomb network of carbon). The distance between neighboring carbon atoms in each six-carbon ring is 0.142 nm. The distance between carbon atoms in each six-carbon ring separated by one carbon atom is 0.246 nm. The distance between carbon atoms in each six-carbon ring separated by two carbon atoms (i.e., the distance between opposite carbon atoms in each six-carbon ring) is 0.284 nm. When a graphene crystal consists of multiple graphene sheets, the distance between neighboring sheets is 0.335 nm.

Figure 8:
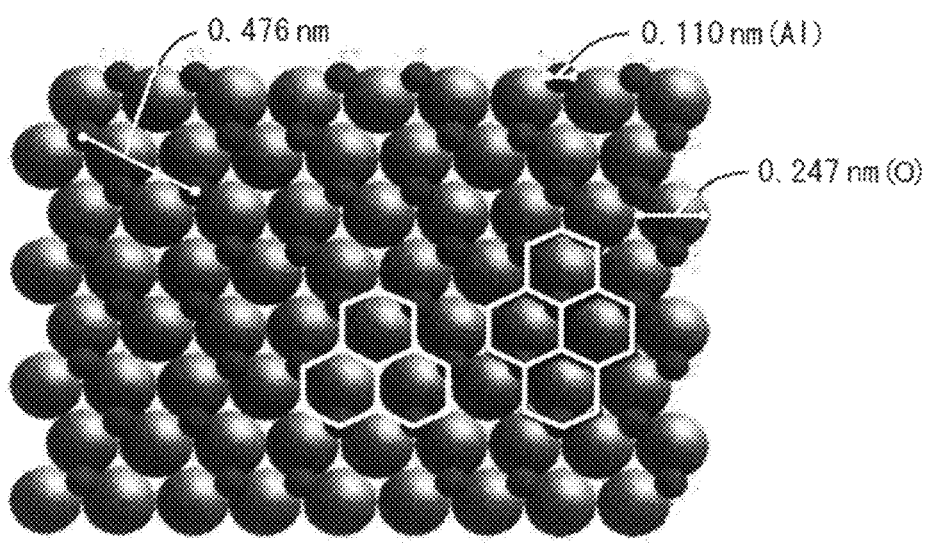
FIG. 8 is a schematic illustration showing the crystal structure of α-alumina viewed along the c-axis.

FIG. 8 is a schematic illustration showing the crystal structure of α-alumina viewed along the c-axis. As shown in FIG. 8, the oxygen atoms are closest packed. The aluminum atoms occupy ⅔ of the valley-like atomic sites (which are each surrounded by a triangle of neighboring three oxygen atoms on the same atomic plane of oxygen atoms) in such a manner as to constitute a network of hexagons of aluminum atoms. The diameter of oxygen atom is 0.247 nm, and the diameter of aluminum atom is 0.110 nm. The distance between aluminum atoms (in each hexagon of aluminum atoms) separated by one aluminum atom is 0.476 nm. In FIG. 8, to facilitate understanding of the arrangement of oxygen atoms and aluminum atoms in the crystal lattice of α-alumina, the surface atomic plane is illustrated as being an atomic plane of aluminum atoms. However, this is not always the case. Rather, contrarily, it is generally thought that the surface atomic plane is an atomic plane of oxygen atoms.

In FIG. 8, a part of the honeycomb network of a graphene crystal is also illustrated. As can be seen, each carbon atom in each six-membered ring of the graphene crystal faces a valley-like atomic site surrounded by a triangle of neighboring three oxygen atoms in the surface oxygen atomic plane of the α-alumina c-plane substrate so that each six-membered ring faces a hexagon formed by the six valley-like atomic sites surrounding one oxygen atom. Thus, the surface oxygen atomic plane of the α-alumina c-plane substrate has a good lattice match with the honeycomb network of the graphene crystal. Such good lattice matching is most likely a cause of the epitaxial growth of a graphene layer (or the preferential orientation of graphene grains) on single crystalline α-alumina.

The geometric relationship between a graphene network of six-carbon rings and the surface aluminum atomic plane of a single crystalline α-alumina c-plane substrate is as follows. The following terminology is used for convenience. As mentioned above, the surface atomic layer of a single crystalline α-alumina c-plane substrate has a network of six-aluminum hexagons. The "A-sites" of each six-aluminum hexagon are defined as the six vertices of the six-aluminum hexagon. The "B-site" of each six-aluminum hexagon is defined as the center of the six-aluminum hexagon. The "C-sites" of each six-aluminum hexagon are defined as the centers of three alternate triangles of the six triangles formed by the three diagonals that join opposite vertices of the six-aluminum hexagon. The six carbon atoms in each six-membered ring of a graphene crystal face corresponding A-, C-, B-, C-, A- and C-sites respectively in clockwise order (when looking into the surface of the single crystalline α-alumina c-plane substrate) in such a manner that the six-carbon ring faces a hexagon formed by the six sites. Again, as described above, the outermost atomic plane of the single crystalline α-alumina c-plane substrate may be either an oxygen atomic plane or an aluminum atomic plane.

Eighth Embodiment of Present Invention

Figure 9:
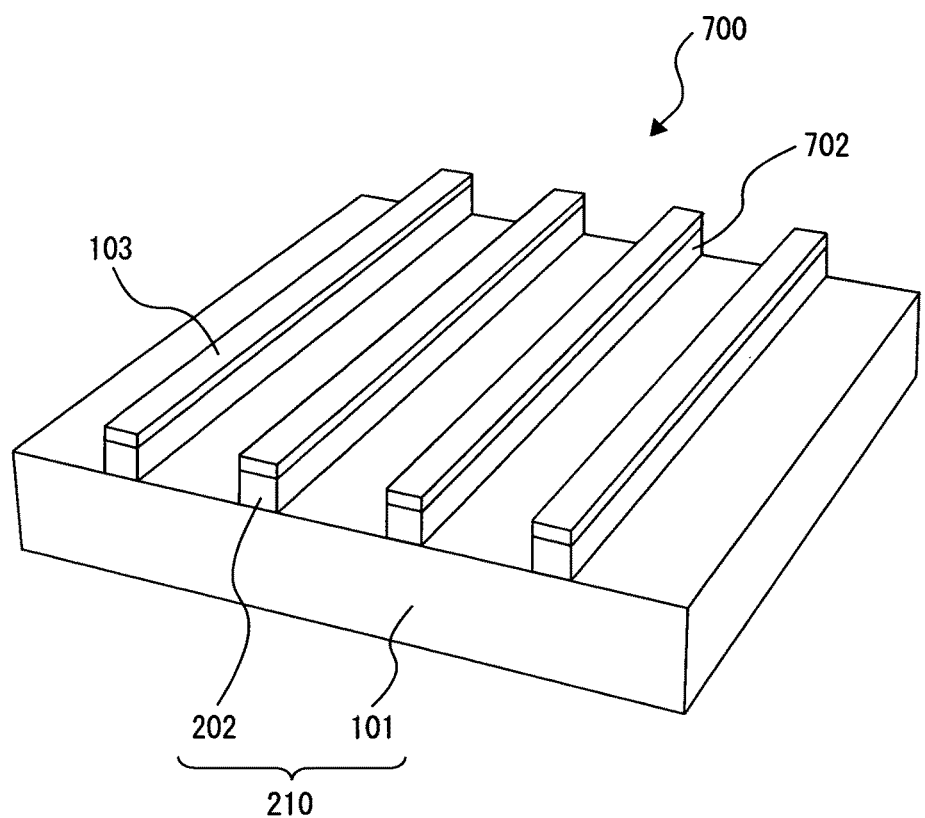
FIG. 9 is a schematic illustration showing a perspective view of an example of wiring lines (strip lines) patterned in an invented graphene-on-oxide substrate.

A method for fabricating wiring for an integrated circuit in an invented graphene-on-oxide substrate will be described with reference to FIG. 9. FIG. 9 is a schematic illustration showing a perspective view of an example of wiring lines (strip lines) patterned in an invented graphene-on-oxide substrate. First, a substrate 210 is prepared by growing, on a single crystalline silicon substrate 101, a silicon oxide film 202 (atomic layers of silicon oxide) having an arithmetic mean surface roughness Ra of 1 nm or less, using, e.g., a method similar to that described above in the second embodiment. Next, the silicon oxide film 202 is patterned using photolithography and dry etching techniques used in conventional semiconductor processing. In this patterning process, portions of the silicon oxide film 202 where wiring lines 702 are to be formed are left unremoved, and the remaining portions of the silicon oxide film 202 are removed.

Then, a graphene layer forming step similar to that described above in the first embodiment is conducted. By this process step, a graphene layer 103 can be selectively grown only on the thus patterned silicon oxide film 202 of the wiring lines 702. After that, a graphene crystal growth step as described above is performed to promote crystal growth of the graphene layer 103, and also to remove impurities and other contaminants introduced during the patterning process. In the manner described above, a substrate 700 having a graphene layer grown thereon according to an eighth embodiment is fabricated.

In the above method, the pattern of the wiring lines 702 is first formed in the silicon oxide film 202, and then the graphene layer 103 is selectively grown only on the patterned silicon oxide film 202. Instead, the graphene layer 103 may first be grown over the entire silicon oxide film 202, which may then be patterned together to form the wiring lines 702. Of course, the graphene-on-oxide substrate according to any one of the first through sixth embodiments may be used. Particularly, a graphene layer on a single crystalline aluminum oxide (α-alumina) c-plane substrate is preferable because of the well aligned growth orientations of the graphene grains.

Ninth Embodiment of Present Invention

Figure 10:
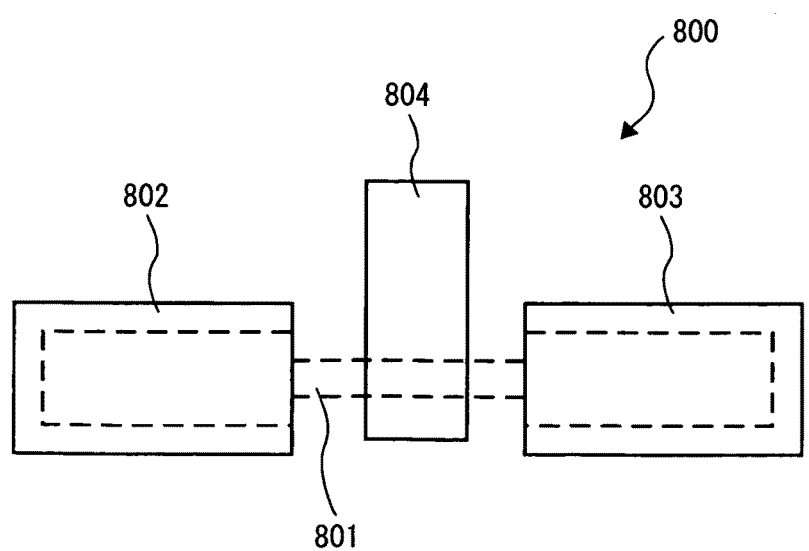
FIG. 10 is a schematic illustration showing a plan view of an example of a field effect transistor formed in an invented graphene-on-oxide substrate.

FIG. 10 is a schematic illustration showing a plan view of an example of a field effect transistor formed in an invented graphene-on-oxide substrate. FIG. 10 illustrates an example in which the channel (and the source and the drain) of a field effect transistor 800 is formed in a graphene layer on a substrate. The field effect transistor 800 includes: a graphene channel 801; a source electrode 802; a drain electrode 803; and a gate electrode 804.

The field effect transistor 800 is formed, e.g., as follows: First, a graphene layer is grown on the entire surface of a substrate. Next, the graphene layer is patterned by photolithography and dry etching to form the channel 801 (and the source and the drain) of the field effect transistor 800 (as indicated by the area within the broken line in FIG. 10). Then, the source electrode 802 and the drain electrode 803 are formed on the source and the drain, respectively. Finally, a gate dielectric film is formed on the channel 801 and then the gate electrode 804 is formed on the gate dielectric film. In this manner, a graphene transistor with a high carrier mobility can be fabricated.

Tenth Embodiment of Present Invention

Figure 11:
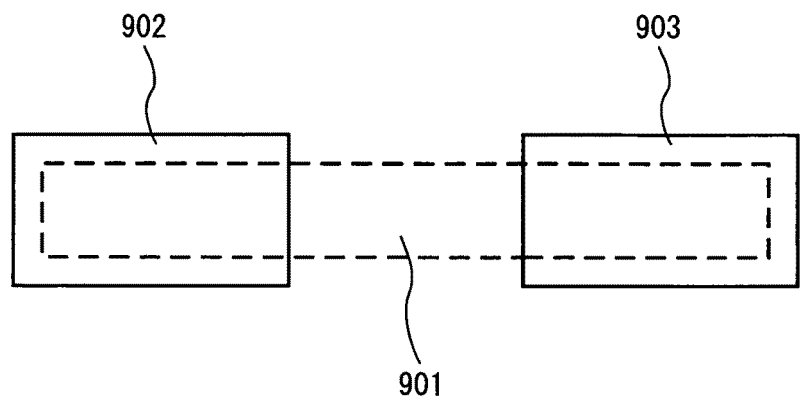
FIG. 11 is a schematic illustration showing a plan view of an example of an optical emitting/receiving device formed in an invented graphene-on-oxide substrate.

FIG. 11 is a schematic illustration showing a plan view of an example of an optical emitting/receiving device formed in an invented graphene-on-oxide substrate. As shown in FIG. 11, an optical emitting/receiving device 900 includes: a graphene optical emitting/receiving layer 901; a positive electrode 902; and a negative electrode 903. In graphene optical emitting devices, electrons and holes are injected from the opposite electrodes into the graphene region having a certain band gap, where they combine by direct transition to generate light. Graphene optical receiving devices detect light in the following manner: Electrons and holes are generated in the graphene region having a certain band gap by light irradiation, and the thus generated electrons and holes are collected by applying a voltage across the opposite electrodes.

The optical emitting/receiving device 900 is formed, e.g., as follows: First, a graphene layer is grown on the entire surface of a substrate. Then, the graphene layer is patterned by photolithography and dry etching to form the active region of the optical emitting/receiving device 900 (as indicated by the area within the broken line in FIG. 11). Finally, the positive electrode 902 and the negative electrode 903 are formed on opposite portions of the active region. In this manner, an optical emitting/receiving device utilizing the band gap of graphene can be fabricated.

Eleventh Embodiment of Present Invention

Figure 12:
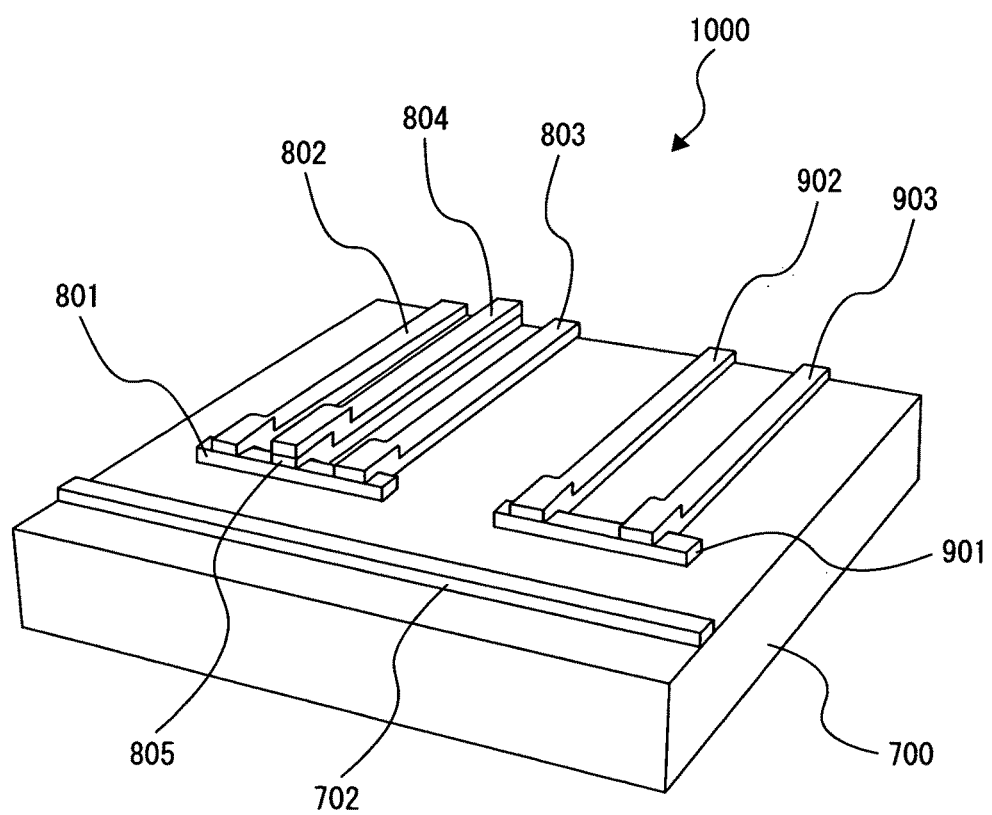
FIG. 12 is a schematic illustration showing a perspective view of an example of an electro-optical integrated circuit formed in an invented graphene-on-oxide substrate.

FIG. 12 is a schematic illustration showing a perspective view of an example of an electro-optical integrated circuit formed in an invented graphene-on-oxide substrate. An electro-optical integrated circuit 1000 shown in FIG. 12 is formed, e.g., as follows: First, a substrate 700 (having graphene wiring lines 702 formed on its surface) as described above in the eighth embodiment is prepared. Then, the channel region 801 of a field effect transistor is formed in a part of the wiring lines 702 and also the active region 901 of a graphene optical emitting/receiving device is formed in another part of the wiring lines 702. Then, the channel region 801 of the field effect transistor is provided with a source electrode 802, a drain electrode 803, and a gate electrode 804 on a gate dielectric film 805. Also, the active region 901 of the graphene optical emitting/receiving device is provided with a positive electrode 902 and a negative electrode 903.

As has been described above, the methods for fabricating a graphene-on-oxide substrate according to the present invention do not require any ultrahigh vacuum processes or any special manufacturing equipment, and therefore the manufacturing equipment cost can be suppressed. In addition, the graphene film according to the invention can be grown at relatively low temperatures, and therefore cheap and large substrates conventionally widely employed in many electronic devices can be used as a starting substrate for growing the invented graphene layer thereon. Thus, the graphene-on-oxide substrates of the invention can be manufactured at very low cost, and therefore are suitable for industrial applications. Furthermore, field effect transistors, optical emitting/receiving devices and wiring lines can be formed in the graphene layer of the invention. Therefore, the graphene layer of the invention will contribute to realization of future electro-optical integrated circuits.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A graphene-on-oxide substrate, comprising:
a substrate having a metal oxide layer formed on its surface; and
a graphene layer formed directly on the metal oxide layer, the graphene layer including at least one atomic layer of graphene, the graphene layer being grown directly on and parallel to a surface of the metal oxide layer, the inter-atomic-layer distance between the graphene atomic layer adjacent to the surface of the metal oxide layer and a surface atomic layer of the metal oxide layer being 0.34 nm or less,
wherein the metal oxide layer contains aluminum.

2. The graphene-on-oxide substrate according to claim 1, wherein the arithmetic mean surface roughness Ra of the metal oxide layer is 1 nm or less.

3. The graphene-on-oxide substrate according to claim 1, wherein the maximum surface height Rz of the metal oxide layer is 10 nm or less.

4. The graphene-on-oxide substrate according to claim 1, wherein the graphene layer is formed of graphene crystal grains, and the average grain size of the graphene crystal grains is 5 nm or more.

5. The graphene-on-oxide substrate according to claim 1, wherein the metal oxide layer is polycrystalline, and the average thickness of the polycrystalline metal oxide layer is 10 nm or more and 500 nm or less.

6. The graphene-on-oxide substrate according to claim 1, wherein the substrate is a single crystalline metal oxide substrate.

7. The graphene-on-oxide substrate according to claim 6, wherein the single crystalline metal oxide substrate is a single crystalline α-alumina c-plane substrate.

8. The graphene-on-oxide substrate according to claim 1, having an area of 20 cm$^2$ or more.

9. An electro-optical integrated circuit formed in the graphene-on-oxide substrate according to claim 1.

10. The electro-optical integrated circuit according to claim 9, wherein a channel of a field effect transistor, an optical emitting device, an optical receiving device and circuit wiring are formed in the graphene layer of the graphene-on-oxide substrate.

11. The graphene-on-oxide substrate according to claim 1, wherein the inter-atomic-layer distance between the graphene atomic layer adjacent to the surface of the metal oxide layer and the surface atomic layer of the metal oxide layer is 0.30 to 0.34 nm.

12. The graphene-on-oxide substrate according to claim 1, wherein the metal oxide layer underlies the graphene layer and the metal oxide layer is disposed between the substrate and the graphene layer.

* * * * *